United States Patent [19]

Sfreddo

[11] 3,828,613

[45] Aug. 13, 1974

[54] TUNER DRIVE ASSEMBLY WITH RESETTING FINE TUNING SHAFT

[75] Inventor: Alfred Sfreddo, Stafford Springs, Conn.

[73] Assignee: General Instrument Corporation, Newark, N.J.

[22] Filed: Apr. 2, 1973

[21] Appl. No.: 346,864

[52] U.S. Cl. .............. 74/10.41, 74/10.54, 74/10.85, 64/DIG. 2, 192/95

[51] Int. Cl. .......................... F16h 35/18, H03j 1/14

[58] Field of Search ............ 74/10.41, 10.54, 10.85, 74/553; 192/95; 64/DIG. 2

[56] References Cited

UNITED STATES PATENTS

| | | | |
|---|---|---|---|
| 1,639,885 | 8/1927 | Gammeter | 74/10.54 |
| 1,643,787 | 9/1927 | Rottgardt | 74/10.54 |
| 2,753,736 | 7/1956 | Mitchell | 192/95 |
| 2,937,535 | 5/1960 | Wezner | 74/10.41 |
| 3,760,640 | 9/1973 | Mayer et al. | 74/10.41 X |

*Primary Examiner*—Allan D. Hermann

[57] ABSTRACT

A tuner drive assembly for use with a tuning mechanism in a T.V. receiver or the like having a coarse tuning shaft and a fine tuning shaft. The fine tuning shaft is rotatably and axially movable relative to the coarse tuning shaft. Means are provided for driving the tuning mechanism and for operatively connecting the drive means to the fine tuning shaft and the coarse tuning shaft so that the tuning mechanism is activated in accordance with the rotation of the coarse tuning shaft and the rotation of the fine tuning shaft. The fine tuning shaft is axially movable between a first position wherein the fine tuning shaft is operably connected to the drive means and a second position wherein the fine tuning shaft is operably disconnected from the drive means. Additionally, means are provided for releasably retaining the fine tuning shaft in a fixed relative position with respect to the coarse tuning shaft such that relative rotation between the shafts is prevented. Further, the assembly contains means for returning the fine tuning shaft to the fixed relative position as the fine tuning shaft is moved from the first position.

10 Claims, 3 Drawing Figures

TUNER DRIVE ASSEMBLY WITH RESETTING FINE TUNING SHAFT

The present invention relates to tuner drive assemblies for controlling a tuner mechanism in a T.V. receiver or the like and more particularly to a tuner drive assembly wherein the limited degree of rotation permitted to the fine tuning knob is incrementally utilized to actuate the fine tuning mechanism from one extreme of the fine tuning spectrum to the other.

Tuners designed when actuated to tune a receiving get such as a television receiver to a preselected one of a plurality of stations or channels are well known and take many forms. Insofar as the present invention is concerned, the precise nature of the means employed in the communications receiver itself to effect tuning to a particular reception frequency forms no part of the present invention. This invention is direct to the mechanism by which a tuning element, whatever its character, is adjusted for precise reception of a particular station or channel. The invention is here specifically disclosed in connection with a tuner design to effect tuning over the entire UHF band, in which there are seventy or more individual channels. To provide a device capable of coarse tuning to any selected one of the seventy or more available UHF channels, with sufficient accuracy so as to be capable of distinguishing in its tuning between any two adjacent channels, presents many problems, both mechanical and electrical. The public has become accustomed to step-by-step tuning in connection with the thirteen channels in the VHF band, and therefore expects similar tuning capability in the UHF band. The much greater number of channels which must be tuned in the UHF band and the very high precision of tuning which is required because of the relatively close spacing of these channels, has given rise to special new mechanical arrangements for the UHF T.V. tuners.

It is important to the tuner manufacturer to produce tuners of extremely small size and at exceedingly low cost. Additionally, reliability and ease of manipulation of the tuning mechanism are features which must be present in the system. The incorporation of all these features into a single unit is often difficult to achieve.

Further, most prior art T.V. tuner drive mechanisms utilize a coarse tuning shaft which is rotated to select the desired channel and a fine tuning shaft which is rotated to more precisely select the frequency of the channel and thus provides more accurate tuning capability. Normally, each of these shafts is rotated by means of a separate coaxially aligned knob. It is desirable that the knobs be so arranged and connected so that the fine tuning shaft rotates along with the coarse tuning knob, thereby preserving the fine tuning setting. It also is desirable that the fine tuning knob have a very appreciable degree of rotation to cause the fine tuning mechanism to cover its necessary range, so that the tuning adjustment will not be overly sensitive. To accomplish this, and in accordance with the present invention, the fine tuning shaft is disconnected from the remainder of the tuning mechanism when the coarse tuning shaft is rotated, so that it will rotate with the coarse tuning shaft. Because of this normally fixed relationship between the two shafts, the fine tuning shaft has only a limited degree of rotation once the coarse tuning shaft is set on the desired channel. However, the fine tuning mechanism itself should require a much greater degree of rotation of the fine tuning shaft to actuate the fine tuner from one extreme to the other in order to provide optimum tuning capability. These two apparently incompatible design requirements are bound to exist. The present invention reconciles them.

It is, therefore, the prime object of the present invention to provide a tuner drive assembly wherein the fine tuning setting is preserved during channel selection and wherein fine tuning can be accomplished throughout the available fine tuning capability of the tuner without over sensitivity.

A second object of the present invention is to provide a tuner drive assembly wherein fine tuning is performed incrementally over the available spectrum of fine tuning capability.

It is apr further object of the present invention to provide a T.V. tuner drive assembly wherein the fine tuning shaft can be disconnected from the fine tuning mechanism at the conclusion of each incremental rotation and automatically reset with respect to the coarse tuning mechanism such that further incremental rotation of the fine tuning knob is possible to activate the fine tuning mechanism throughout the available spectrum of fine tuning positions.

Another object of the present invention is to provide the tuner drive mechanism construction in which all of the rotating parts of the assembly are sturdily and reliably mounted for long life and sure and easy rotation, yet in which the parts take up a minimal amount of space and are of minimal cost.

Still another object of the present invention is to devise tuner assembly, the parts of which can be readily and inexpensively manufactured and assembled, and in which a replacement of defective parts is facilitated.

In accordance with the present invention, a tuner drive assembly for use with a tuning mechanism is provided with a coarse tuning shaft and a fine tuning shaft. The coarse tuning shaft and the fine tuning shaft are coaxially aligned with the fine tuning shaft preferably being mounted within the coarse tuning shaft. Each of these shafts is provided with the appropriate control knob to facilitate manipulation of the shafts and thus the tuner. The fine tuning shaft is rotatable relative to the coarse tuning shaft as well as being axially movable with respect thereto. Means for driving the tuning mechanism are provided as well as means for operably connecting the drive means to the fine tuning shaft and to the coarse tuning shaft so that the tuning is achieved in accordance with the rotation of each of these shafts.

The fine tuning shaft is axially movable relative to the coarse tuning shaft between a first position wherein the fine tuning shaft is operably connected to the drive means and a second position wherein the fine tuning shaft is operably disconnected from the drive means. Means are provided for releasably retaining the fine tuning shaft in a fixed relative rotational position with respect to the coarse tuning shaft such that the fine tuning shaft will rotate along with the coarse tuning shaft when the fine tuning shaft is disconnected from the drive means. When the fine tuning shaft is axially moved with respect to the coarse tuning shaft, the retaining means is released and the fine tuning shaft operably connected to the drive means. The fine tuning shaft can then be rotated independently of the coarse tuning shaft within a limited rotational increment, to provide for fine tuning. Means are provided for returning the fine tuning shaft to the fixed relative rotational position with respect to the coarse tuning shaft when the fine tuning shaft is disconnected from the drive means. Even though the rotation of the fine tuning shaft with respect to the coarse tuning shaft is limited, the drive means can be incrementally actuated by the limited rotation of the fine tuning shaft repeatedly in order to provide tuning throughout the available spectrum of fine tuning capability.

Means associated with the drive means are provided to prevent the rotation of the fine tuning shaft, when it is engaged with drive means, from affecting the position of the coarse tuning shaft. Thus the rotation of the fine tuning shaft will not disturb the channel setting.

To the accomplishment of the above, and to such other aspects as they hereinafter appear, the present invention relates to the structure and arrangement of a tuner drive assembly as defined in the appended claims and as described in the specification, taken together with the accompanying drawings, wherein like numerals refer to like parts and in which:

The tuning element, generally designated A, which may be constituted by a rotary variable condenser-tuned transmission line or the like, is provided with a control shaft, generally designated B, mounted in a manner accessible to the exterior of the tuner. A rotatable coarse tuning shaft, generally designated C, is designed to effect tuning of the element A from one channel to the next. Normally, a coarse tuning knob (not shown) is provided on the extreme exterior end of the coarse tuning shaft to facilitate rotation of the coarse tuning shaft and therefore channel selection. Mounted within the coarse tuning shaft C, and coaxially aligned therewith, is a fine tuning shaft D. A fine tuning knob (not shown) is provided on the extreme exterior end of the fine tuning shaft D to facilitate rotation of the fine tuning shaft. The fine tuning shaft D is both rotationally and axially movable with respect to the coarse tuning shaft D. The fine tuning knob is also used to facilitate axial movement of the fine tuning shaft D with respect to the coarse tuning shaft C by pushing the fine tuning knob and thus the fine tuning shaft D towards the tuning mechanism A.

The coarse tuning shaft C is operably connected to the drive means, generally designated as E, which in turn is operably connected to control shaft B to actuate tuning mechanism A. Fine tuning shaft D is axially movable with respect to coarse tuning shaft C between a first position in which the fine tuning shaft D is operably connected to drive means E and a second position (as shown in FIGS. 2 and 3) in which the fine tuning shaft D is operably disconnected from drive means E.

Figure 2:
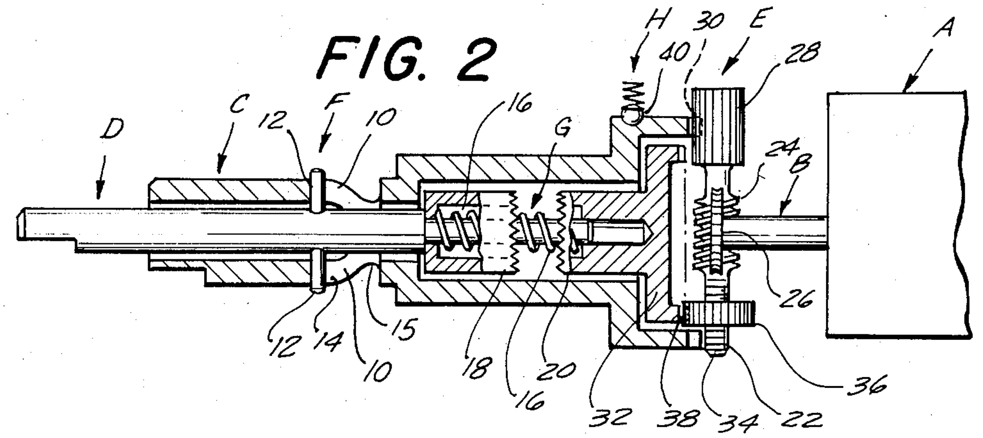
FIG. 2 is a side cross-sectional view of the embodiment of FIG. 1, taken along the line 2—2 of FIG. 1.
Figure 3:
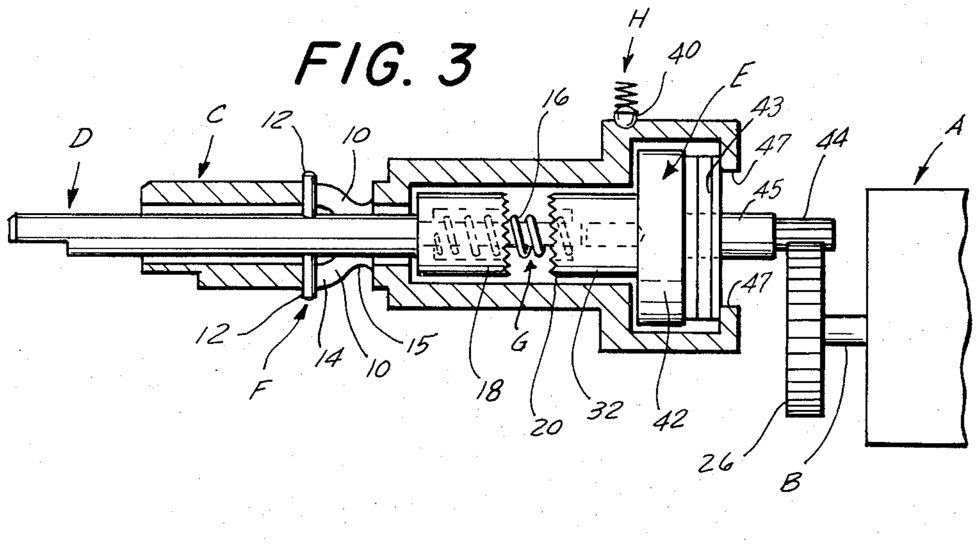
FIG. 3 is a view similar to FIG. 1 but of a second embodiment of the present invention.

It can be readily seen from FIGS. 2 and 3 that axial movement of fine tuning shaft D, caused by pushing the fine tuning knob toward the tuning mechanism, will operably connect the fine tuning shaft D to drive means E. Axial movement in the reverse direction will serve to disengage fine tuning shaft D from drive means E. During the time when fine tuning shaft D is axially moved to operably connect it to the drive means E, the rotation of fine tuning shaft D will cause drive means E to activate tuning mechanism A to achieve fine tuning.

Means, generally designated F, for releasably retaining the fine tuning shaft D in a fixed relative rotational position with respect to coarse tuning shaft C are provided in each of the embodiments illustrated in FIGS. 2 and 3. Means G are also provided for use in conjunction with retaining means F for returning fine tuning shaft D to its original relative fixed position with respect to coarse tuning shaft C, after the fine tuning knob D has been released and the fine tuning shaft D is disengaged from drive means E.

Preferably, means, generally designated as H, are provided to prevent the rotation of the fine tuning shaft D from affecting the position of the coarse tuning shaft C when the fine tuning shaft D is operably connected to drive means E. Means H, therefore, permits the fine tuning function to be performed, after channel selection has been accomplished, without disturbing the channel selection.

More specifically, the present invention comprises a tuner drive assembly which is manipulated to control a tuner mechanism A through the use of coaxially aligned fine and coarse tuning shafts. Coarse tuning shaft C is rotatable in order to select the desired channel. Fine tuning shaft D is likewise rotatable in order to accomplish the fine tuning necessary to more accurately adjust tuner A to the desired frequency. Fine tuning shaft D is preferably located with coarse tuning shaft C and designed to be axially movable with respect to coarse tuning shaft C as well as rotationally movable with respect thereto. Fine tuning shaft D is axially movable with respect to coarse tuning shaft C from a first position (towards right in the drawings) wherein fine tuning shaft D is operably connected to tuner A and a second position (towards the left in the drawings) wherein fine tuning shaft D is operably disconnected from tuner A to permit fine tuning. Thus, when fine tuning shaft D is in the second position, the rotation of this shaft will not affect the tuning mechanism per se.

It is desirable to have coarse tuning shaft C and fine tuning shaft D rotate simultaneously during channel selection, without having the rotation of fine tuning shaft D affect the tuner mechanism A. To accomplish this, fine tuning shaft D is normally situated in the second position during channel selection so that it is not operably connected to tuner A. When fine tuning shaft D is in the second position, releasable retaining means F maintains the fine tuning shaft D in a fixed relative rotational position with respect to coarse tuning shaft C. The operation of retaining means F will cause the shafts to rotate together during channel selection. However, since fine tuning shaft D is in the second position when retaining means F is operable, and therefore, operably disengaged from tuner mechanism A, the rotation of fine tuning shaft D during channel selection will have no effect on the tuner.

When axial movement of fine tuning shaft D toward the first position occurs by pushing the fine tuning shaft towards tuner A, the retaining means F is released thereby permitting fine tuning shaft D to rotate independently of coarse tuning shaft C. The retaining means F, will, however, only permit the rotation of fine tuning shaft D through a limited arc. This axial movement of fine tuning shaft D towards the first position also engages it with drive means E such that the rotation of fine tuning shaft D is transferred to the tuner A in order to accomplish the fine tuning function.

Figure 1:
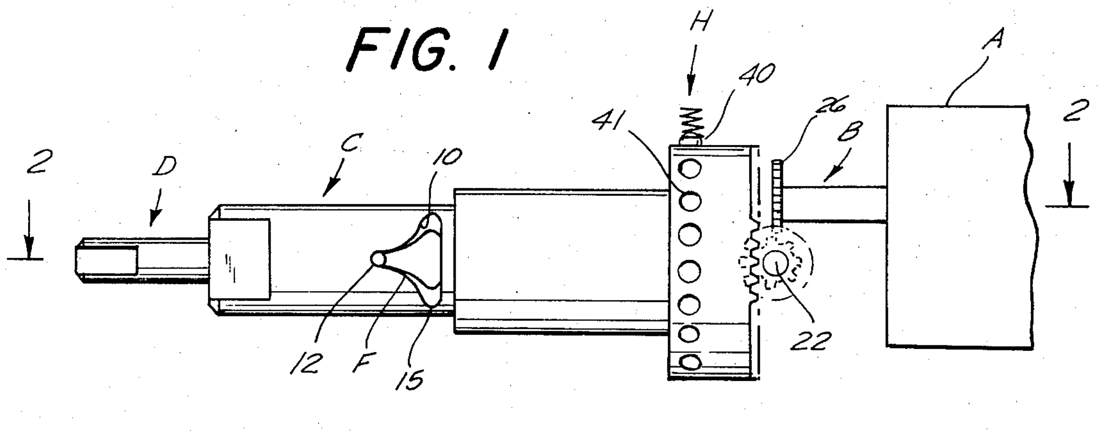
FIG. 1 is a side elevational view of an exemplary embodiment of the present invention.

Releasable retaining means F, which determines the rotational relationship between fine tuning shaft D and coarse tuning shaft C, comprises a pair of slots 10, disposed on diametrically opposed sections of coarse tuning shaft C. One of these slots 10 is visible in FIG. 1. Although only one of the slots 10 is necessary to establish the required relationship between fine tuning shaft D and coarse tuning shaft C, the preferred embodiments of the present invention are each equipped with two of these slots, one on each side of coarse tuning shaft C. This configuration is preferable because it provides for greater structural stability without requiring any additional space. Projecting out from the surface of fine tuning shaft D is a pin 12 which radially extends into slot 10. Of course, for each slot 10 present on coarse tuning shaft C, a pin 12 is provided projecting from the surface of fine tuning shaft D. Slot 10 is shaped to have a narrow portion 14 and a broad portion 15 (most readily visible in FIG. 1), thus giving the slot 10 a generally triangular shape. The narrow portion 14 of slot 10 is shaped to retain pin 12 when fine tuning shaft D is in the second position. When pin 12 rests in narrow portion 14, fine tuning shaft D is prevented from rotating with respect to coarse tuning shaft C. The rotation of coarse tuning shaft C when the fine tuning shaft D is in this position serves also to rotate fine tuning shaft D. Thus the shafts rotate together during channel selection.

The axial movement of fine tuning shaft D, caused by pushing the fine tuning shaft D towards tuner A, will cause pin 12 to move towards broad portion 15 of slot 10. Once situated within the broad portion 15 of slot 10, pin 12 is free to move through an arc defined by the extremities of slot 10. Since pin 12 is mounted on fine tuning shaft D, fine tuning shaft D will be able to rotate with respect to coarse tuning shaft C through the arc defined by the relationship between pin 12 and broad portion 15 of slot 10. Thus, when fine tuning shaft D is in the first position (to the right as shown in the drawings), limited relative rotational movement with respect to coarse tuning shaft C is possible.

The axial movement of fine tuning shaft D towards the first position serves not only to move pin 12 within slot 10 but also to operably engage fine tuning shaft D to the remainder of the assembly. When fine tuning shaft D is in the first position, and therefore permitted a limited degree of rotation with respect to coarse tuning shaft C, fine tuning shaft D is operably engaged to tuner A and thus the rotation of fine tuning shaft D will accomplish the fine tuning function.

A spring member 16 is provided to urge fine tuning shaft D to axially move towards the second position thus operably disengaging the fine tuning shaft D from tuner A. This axial movement causes pin 12 to be guided by the sides of slot 10 from broad portion 15 to narrow portion 14 of slot 10, thus rotating fine tuning shaft D back to a fixed rotational position with respect to coarse tuning shaft C. Spring member 16, in conjunction with the slot and pin combination, provide a means for returning fine tuning shaft D to the fixed relative rotational position with respect to the coarse tuning shaft C. Regardless of the relative positions of the fine tuning shaft D and the coarse tuning shaft C at the commencement of the axial movement caused by spring member 16, the fine tuning shaft D will rotate back to the fixed position with respect to coarse tuning shaft D because of the tapering of the sides of slot 10 as pin 12 travels from broad portion 15 towards narrow portion 14. The relative rotation between fine tuning shaft D and coarse tuning shaft C caused by the slot and pin combination as fine tuning shaft D is axially moved by spring 16 will, however, not affect the fine tuning mechanism because during the rotation of fine tuning shaft D which returns it to the fixed position, it is operably disengaged from the remainder of the assembly.

Fine tuning shaft D, when in the first position, is operably connected to a drive means E which transmits the rotation of the shaft to tuner A. This connection comprises a pair of oppositely disposed crown gears 18 and 20, crown gear 18 being situated on the extreme end of fine tuning shaft D and crown gear 20 being situated on the forward end of drive means E. When fine tuning shaft D is axially moved to the first position (wherein limited rotational movement of fine tuning shaft D relative to coarse tuning shaft C is permitted), crown gear 18 meshes with crown gear 20. The meshing of crown gears 18 and 20 provides the operable connection by which the rotational torque from the fine tuning shaft D is transmitted to drive means E. Coarse tuning shaft C is also operably connected to drive means E. Drive means E serves to operably connect each of the tuning shafts C and D to tuner mechanism A in order to manipulate the tuner mechanism A in accordance with the rotation of coarse tuning shaft C and fine tuning shaft D, respectively. Thus, the coarse and fine tuning functions of the tuner mechanism A are controlled by the movement of the tuning shafts C and D by means of an operable connection achieved by drive means E.

In the embodiment illustrated in FIG. 2, the drive means E comprises a rotatable and linearly advanceable drive shaft 22. The rotation and advancement of drive shaft 22 serve to manipulate tuner mechanism A to achieve the coarse and fine tuning functions, respectively. A spur gear 28 is mounted on drive shaft 22 such that the rotation of gear 28 will rotate drive shaft 22. Spur gear 28 meshes with a crown gear 30 situated on the extreme end of coarse tuning shaft C such that the rotation of coarse tuning shaft C will rotate gear 28 and thus shaft 22.

Drive shaft 22 is provided with a threaded surface portion 34 upon which an internally threaded spur gear 36 is rotatably mounted. Spur gear 36 meshes with a crown gear 38 situated on the extreme end of secondary shaft 32. Thus the rotation of secondary shaft 32 is transferred to spur gear 36. Means are provided (not shown) for retaining spur gear 36 in a fixed relative axial position with respect to crown gear 38 to eliminate any axial movement between these gears. Because of its fixed axial position, the rotation of spur gear 36 will linearly advance drive shaft 22 in a direction dependent upon the direction of rotation, due to the meshing of the surface threads 34 and the internal threads of gear 36. Thus, shaft 22 is rotated by the rotation of coarse tuning shaft C and linearly advanced by the rotation of fine tuning shaft D.

A worm 24 is also situated on drive shaft 22. Worm 24 will rotate in accordance with the rotation of drive shaft 22 and linearly advance in accordance with the linear advancement of drive shaft 22. Tuner mechanism A has a rotary control shaft B extending therefrom. The rotation of control shaft B manipulates the tuning mechanism A to achieve both tuning functions. Situated at the end of control shaft B and meshing with worm 24 is drive gear 26. The rotation of worm 24 and the linear advancement of worm 24 both serve to rotate drive gear 26 and thus control shaft B. In this way, the rotation of coarse tuning shaft C rotates drive shaft 22 to rotate control shaft B to achieve the coarse tuning function in tuner mechanism A. Likewise, the rotation of fine tuning shaft D linearly advances drive shaft 22 to rotate control shaft B and achieve the fine tuning function in tuner mechanism A.

Obviously, it is undesirable for the rotation of fine tuning shaft D to affect the position of coarse tuning shaft C once a desired channel has been selected. In order to effectively prevent this, a preventing means H is provided. Preventing means H comprises a conventional detent means acting on coarse tuning shaft C. The detent means shown herein is a spring-loaded detent ball 40 and a plurality of detents 41 situated on the outer surface of coarse tuning shaft C. The force which spring-loaded detent ball 40 exerts on detents 41 will be greater than the friction between spur gear 36 and threaded portion of drive shaft 22. Therefore, the rotation of secondary element 32 will rotate spur gear 36 but the rotation of spur gear 36 will not rotate the drive shaft 22. The rotation of spur gear 36 will serve only to linearly advance drive shaft 22. The linear advancement of drive shaft 22 does not affect the position of coarse tuning shaft C. Therefore, a channel setting will not be affected by an adjustment of the fine tuning.

In operation, the coarse tuning shaft C is rotated to select the desired channel from position to position defined by the detent means. This rotation rotates drive shaft 22 because of the meshing of spur gear 28, mounted on drive shaft 22, and crown gear 30, located on the extreme end of coarse tuning shaft C. The rotation of drive shaft 22 is transferred to control shaft B by means of worm 24 and drive gear 26, thus actuating the tuning mechanism A. In this way the desired station or channel is selected. The rotation of the coarse tuning shaft C also causes the rotation of fine tuning shaft D because pin 12 is held within the narrow portion 14 of slot 10 by the urging of spring 16. However, the rotation of fine tuning shaft D, when it is in this axial position, does not rotate secondary element 32 because crown gear 18 is disengaged from crown gear 20.

Once the appropriate channel or station has been selected, the fine tuning shaft D is axially moved to a position wherein it is operably connected to secondary shaft 32. This operable connection occurs by the meshing of crown gears 18 and 20. In this position, pin 12 is in the broad portion 15 of slot 10 and therefore limited rotational movement of the fine tuning shaft D is permitted with respect to hthe coarse tuning shaft C. The rotation of the fine tuning shaft D rotates secondary shaft element 32 to rotate spur gear 36 thus linearly advancing drive shaft 22. The linear advancement of drive shaft 22 moves worm 24 to rotate drive gear 26 and thus control shaft B. The rotation of control shaft B actuates tuning mechanism A to achieve fine tuning.

In the event that the rotation of fine tuning shaft D is not sufficient to accomplish the necessary fine tuning because of the limitation placed on the movement of pin 12 due to the shape of the slot, fine tuning shaft D is released and is axially moved by spring member 16 to disengage it from secondary shaft 32. The fine tuning shaft D rotates back into the original fixed relative position with respect to coarse tuning shaft C without affecting the tuning mechanism A, as pin 12 is guided by the sides of slot 10 into narrow portion 14. Further fine tuning can be achieved by the rotation of fine tuning shaft D after axial movement of fine tuning shaft D to engage secondary shaft 32. If the desired fine tuning is not yet achieved, again because of the limitation of the rotation of fine tuning shaft D due to the shape of slot 10, the fine tuning shaft D is released thereby resetting it with respect to the coarse tuning shaft C. Once again the shaft can be axially moved and then rotated for additional fine tuning. In this way, fine tuning throughout the available spectrum of fine tuning capability is achieved incrementally by the repeated alternate axial movement, rotation and automatic resetting of the fine tuning shaft D.

The functioning of the second embodiment illustrated in FIG. 3 is similar to that of the embodiment previously described except that drive means E takes a different form. In the second embodiment, drive means E comprises a rotatable friction clutch comprising members 42 and 43 which are mounted on secondary shaft 32 to be driven thereby. A shaft 45 is mounted between member 43 and a pinion gear 44 such that pinion gear 44 is rotated by the rotation of members 42 and 43. Pinion gear 44 meshes with drive gear 26 in order to transfer the rotation of the frictional clutch to drive gear 26 and therefore control shaft B. Member 43 is provided with a clutch surface on the exterior thereof. The periphery of this clutch surface is urged into contact with portion 47 of coarse tuning shaft C. Thus, the rotation of coarse tuning shaft C rotates the friction clutch and thus pinion 44 to drive the tuning mechanism A.

The rotation of fine tuning shaft D, when it is engaged with secondary shaft element 32, will also rotate the friction clutch to drive tuner mechanism A. However, the rotation of the friction clutch caused by the rotation of fine tuning shaft D will not rotate the coarse tuning shaft C because the friction between the clutch surface on member 43 and portion 47 of coarse tuning shaft C is not sufficient to overcome the force of detent means 40 on coarse tuning shaft C. Therefore, the rotation of the fine tuning shaft D will act to rotate pinion gear 44 but not affect the position of coarse tuning shaft C. Aside from the alternate configuration of the drive means E, the operation of the second embodiment is precisely the same as the operation previously described for the first embodiment.

While but two embodiments of the present invention have been specifically disclosed herein, it will be apparent that many variations may be made therein, all within the scope of the invention as defined by the following claims.

I claim:

1. A tuner drive assembly for use with a tuning mechanism comprising a coarse tuning shaft, a fine tuning shaft, said fine tuning shaft being movable relative to said coarse tuning shaft in a first sense and a second sense, drive means for driving said tuning mechanism, means operatively connecting said drive means to said fine tuning shaft and said coarse tuning shaft to drive said tuning mechanism in accordance with the movement of said coarse tuning shaft and the movement of said fine tuning shaft in said first sense, said fine tuning shaft being movable relative to said coarse tuning shaft in said second sense between a first position wherein said fine tuning shaft is operably connected to said drive means and a second position wherein said fine tuning shaft is operably disconnected from said drive means, means for releasably retaining said fine tuning shaft in a fixed relative position with respect to said coarse tuning shaft such that relative movement in said first sense between said shafts is prohibited, and means for returning said fine tuning shaft to said fixed relative position as said fine tuning shaft is moved from said first position.

2. The assembly according to claim 1 wherein said drive means comprises means for preventing the movement of said fine tuning shaft in said first sense from affecting the position of said coarse tuning shaft when said fine tuning shaft is in the first position.

3. The assembly according to claim 1 wherein said fine tuning shaft and said coarse tuning shaft are coaxially aligned and wherein said fine tuning shaft is rotatably and axially movably mounted within said coarse tuning shaft, said rotational and axial movements comprising said first and second movement senses, respectively.

4. The assembly according to claim 1 wherein said retaining means comprises a slot on said coarse tuning shaft and a pin mounted on said fine tuning shaft and extending into said slot.

5. The assembly according to claim 4 wherein said slot has a narrow portion in which said pin rests when said fine tuning shaft is in said second position such that said fine tuning shaft is retained in said fixed position with respect to said coarse tuning shaft.

6. The assembly according to claim 5 wherein said returning means comprises a spring member acting on said fine tuning shaft to urge said fine tuning shaft towards said second position such that said fine tuning shaft is operably disconnected from said drive means and said pin is moved into said narrow portion of said slot.

7. The assembly according to claim 2 wherein said drive means further comprises a rotatable and linearly avancable drive shaft, means for rotating said drive shaft in accordance with the movement of said coarse tuning shaft in said first sense, means for linearly advancing said drive shaft in accordance with the movement of said fine tuning shaft in said first sense and means operably connecting said drive shaft with said tuning mechanism such that said tuning mechanism is controlled by the rotation and linear advancement of said drive shaft.

8. The assembly according to claim 2 wherein said drive means further comprises a friction clutch operably connecting said coarse tuning shaft with said tuning mechanism such that said tuning mechanism is controlled by the movement of said coarse tuning shaft in said first sense, means operably connecting said fine tuning shaft to said friction clutch such that said tuning mechanism is controlled by the movement of said fine tuning shaft in said first sense.

9. The assembly according to claim 6 wherein said slot is shaped to guide said pin towards said narrow portion as said fine tuning shaft is urged towards said second position by said spring member.

10. The assembly according to claim 9 wherein said slot is shaped to permit said fine tuning shaft limited independent movement in said first sense with respect to said coarse tuning shaft when said fine tuning shaft is in said first position.

* * * * *